(12) United States Patent
Ikeda et al.

(10) Patent No.: US 9,000,451 B2
(45) Date of Patent: Apr. 7, 2015

(54) LIGHT-EMITTING DEVICE AND LIGHTING DEVICE

(71) Applicant: Semiconductor Energy Laboratory Co., Ltd., Kanagawa-ken (JP)

(72) Inventors: Hisao Ikeda, Kanagawa (JP); Takuya Kawata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/908,438

(22) Filed: Jun. 3, 2013

(65) Prior Publication Data

US 2013/0265762 A1   Oct. 10, 2013

Related U.S. Application Data (63) Continuation of application No. 13/189,770, filed on Jul. 25, 2011, now Pat. No. 8,455,884.

(30) Foreign Application Priority Data

Jul. 26, 2010 (JP) ................... 2010-166961

(51) Int. Cl.
*H01L 27/15* (2006.01)
*H01L 31/12* (2006.01)
*H01L 33/00* (2010.01)
*F21V 5/00* (2006.01)
(Continued)

(52) U.S. Cl.
CPC . *F21V 5/00* (2013.01); *F21S 6/003* (2013.01); *H01L 51/5275* (2013.01); *F21Y 2101/02* (2013.01); *F21Y 2105/001* (2013.01); *F21Y 2105/008* (2013.01); *H01L 2251/5361* (2013.01)

(58) Field of Classification Search
USPC .......................... 257/79, 88, 89, 98
See application file for complete search history.

(56) References Cited

U.S. PATENT DOCUMENTS 6,410,942 B1   6/2002 Thibeault et al.
2001/0019378 A1*   9/2001 Yamaguchi ................ 349/61
(Continued)

FOREIGN PATENT DOCUMENTS

JP   2773720 B2   7/1998
JP   2001-305306   10/2001
(Continued)

OTHER PUBLICATIONS

International Search Report re application No. PCT/JP2011/066504, dated Sep. 6, 2011.
(Continued)

*Primary Examiner* — Phuc Dang
(74) *Attorney, Agent, or Firm* — Husch Blackwell LLP (57) ABSTRACT

It is an object to improve light extraction efficiency in a light-emitting device and a lighting device. A light-emitting device includes a plurality of light-emitting portions, and a plurality of hemispherical components provided so as to overlap with the plurality of light-emitting portions. The plurality of hemispherical components are provided so as not to form a space therebetween in a region where the plurality of hemispherical components are adjacent to each other. When a refractive index of the hemispherical component is n and a radius of a bottom surface of the hemispherical component is b, the light-emitting portion is provided inside a circle whose radius r from a center of the bottom surface of the hemispherical component is b/n.

16 Claims, 9 Drawing Sheets

(51) Int. Cl.
*F21S 6/00* (2006.01)
*H01L 51/52* (2006.01)
*F21Y 101/02* (2006.01)
*F21Y 105/00* (2006.01)

(56) References Cited

U.S. PATENT DOCUMENTS

| | | |
|---|---|---|
| 2005/0007669 A1* | 1/2005 | Sakai .............................. 359/619 |
| 2008/0117519 A1* | 5/2008 | Chari et al. .................... 359/619 |
| 2008/0129184 A1 | 6/2008 | Nishida et al. |
| 2008/0129188 A1 | 6/2008 | Egi et al. |
| 2008/0129933 A1 | 6/2008 | Nishida et al. |
| 2008/0130122 A1 | 6/2008 | Egi et al. |
| 2008/0144180 A1 | 6/2008 | Nishida et al. |
| 2008/0158682 A1 | 7/2008 | Egi et al. |
| 2008/0165315 A1 | 7/2008 | Nishida et al. |
| 2009/0239318 A1 | 9/2009 | Nakamura et al. |
| 2010/0301367 A1 | 12/2010 | Nakamura et al. |
| 2011/0057210 A1* | 3/2011 | Sonoda et al. ................... 257/88 |
| 2011/0062476 A1* | 3/2011 | Tobise .............................. 257/98 |
| 2011/0073897 A1* | 3/2011 | Kang et al. ...................... 257/98 |
| 2011/0085352 A1* | 4/2011 | Ito et al. ......................... 362/617 |

FOREIGN PATENT DOCUMENTS

| | | |
|---|---|---|
| JP | 2003-0031353 A | 1/2003 |
| JP | 2003-150082 | 5/2003 |
| JP | 2003-317931 | 11/2003 |
| JP | 2009-51200 | 3/2009 |
| JP | 2009-130132 | 6/2009 |
| WO | WO 2008/041771 A1 | 4/2008 |
| WO | WO 2009/145298 A1 | 12/2009 |

OTHER PUBLICATIONS

Written Opinion re application No. PCT/JP2011/066504, dated Sep. 6, 2011.

* cited by examiner

LIGHT-EMITTING DEVICE AND LIGHTING DEVICE

This application is a continuation of copending U.S. application Ser. No. 13/189,770 filed on Jul. 25, 2011, which is incorporated herein by reference.

BACKGROUND OF THE INVENTION

1. Field of the Invention

The technical field relates to a light-emitting device and a method for manufacturing the light-emitting device and also relates to a lighting device and a method for manufacturing the lighting device.

2. Description of the Related Art

In recent years, light-emitting devices including electroluminescence (hereinafter also referred to as EL) elements as self-luminous elements have been actively researched. The light-emitting devices are expected to be used for organic EL displays, organic EL lighting devices, and the like.

Since planar light emission can be performed with an EL element, in the case of using the EL element for a lighting device, a sheet-like lighting device can be manufactured, for example (Patent Document 1).

REFERENCE

Patent Document

[Patent Document 1] Japanese Published Patent Application No. 2009-130132

SUMMARY OF THE INVENTION

In the device disclosed in Patent Document 1, there is the following problem: total reflection is caused at an interface between a glass substrate and the air, and only several tens of percents of light emitted from an EL element can be extracted to the outside.

In view of the above problem, it is an object to improve light extraction efficiency in a light-emitting device and a lighting device.

In addition, it is an object to provide a novel structure of a light-emitting device and a lighting device. Further, it is an object to provide a novel method for manufacturing a light-emitting device and a lighting device.

Light emitted from a light-emitting portion is extracted to the outside through a hemispherical component, which is a feature of an embodiment of the present invention. In other words, light is transmitted through the hemispherical component, whereby total reflection of the light is suppressed as much as possible.

An embodiment of the present invention is a light-emitting device including a plurality of light-emitting portions, and a plurality of hemispherical components provided so as to overlap with the plurality of light-emitting portions. The plurality of hemispherical components are provided so as not to form a space therebetween in a region where the plurality of hemispherical components are adjacent to each other. That is, the plurality of hemispherical components are arranged with a closest packed structure.

Another embodiment of the present invention is a light-emitting device including a plate-like component, a plurality of light-emitting portions provided over one surface of the plate-like component, and a plurality of hemispherical components provided over the other surface of the plate-like component so as to overlap with the plurality of light-emitting portions. The plurality of hemispherical components are provided so as not to form a space therebetween in a region where the plurality of hemispherical components are adjacent to each other.

Another embodiment of the present invention is a light-emitting device including a plurality of light-emitting portions, and a plurality of hemispherical components provided so as to overlap with the plurality of light-emitting portions. When a refractive index of the hemispherical component is n and a radius of a bottom surface of the hemispherical component is b, the light-emitting portion is provided inside a circle whose radius r from the center of the bottom surface of the hemispherical component is b/n.

Another embodiment of the present invention is a light-emitting device including a plate-like component, a plurality of light-emitting portions provided over one surface of the plate-like component, and a plurality of hemispherical components provided over the other surface of the plate-like component so as to overlap with the plurality of light-emitting portions. When a refractive index of the hemispherical component is n and a radius of a bottom surface of the hemispherical component is b, the light-emitting portion is provided inside a circle whose radius r from the center of the bottom surface of the hemispherical component is b/n.

Another embodiment of the present invention is a lighting device including the above-described light-emitting device.

In this specification, the term "light-emitting device" means all devices which perform light emission. Therefore, a lighting device including a light-emitting portion is simply called a light-emitting device in some cases.

Light extraction efficiency in a light-emitting device and a lighting device can be improved.

In addition, various performance of a light-emitting device and a lighting device can be improved; for example, white light emission with high quality can be achieved.

DETAILED DESCRIPTION OF THE INVENTION

Hereinafter, embodiments will be described in detail with reference to the accompanying drawings. Since embodiments described below can be embodied in many different modes, it is easily understood by those skilled in the art that modes and details thereof can be variously changed without departing from the spirit and the scope of the present invention. Therefore, the present invention should not be construed as being limited to the following description of the embodiments. In the drawings for explaining the embodiments, the same parts or parts having similar functions are denoted by the same reference numerals, and description of such parts is not repeated.

Embodiment 1

In this embodiment, an example of a structure of a light-emitting device will be described.

Figure 1A:
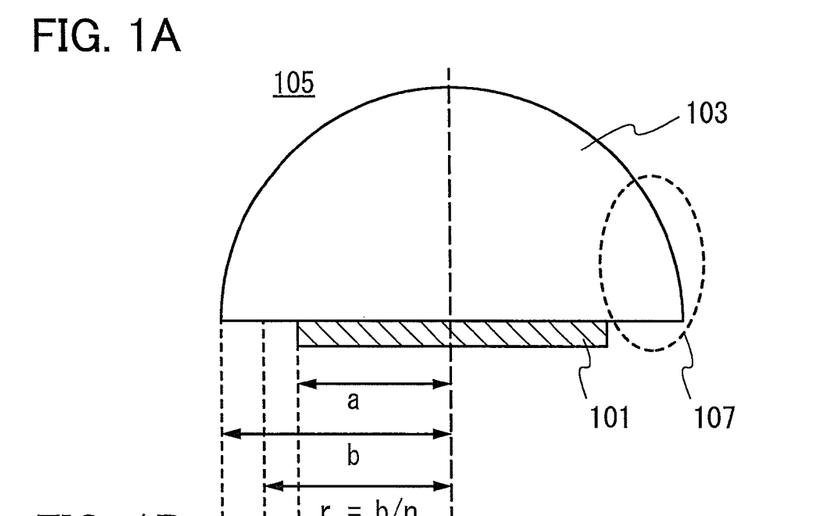
FIGS. 1A and 1B illustrate an example of a light-emitting device.
Figure 1B:
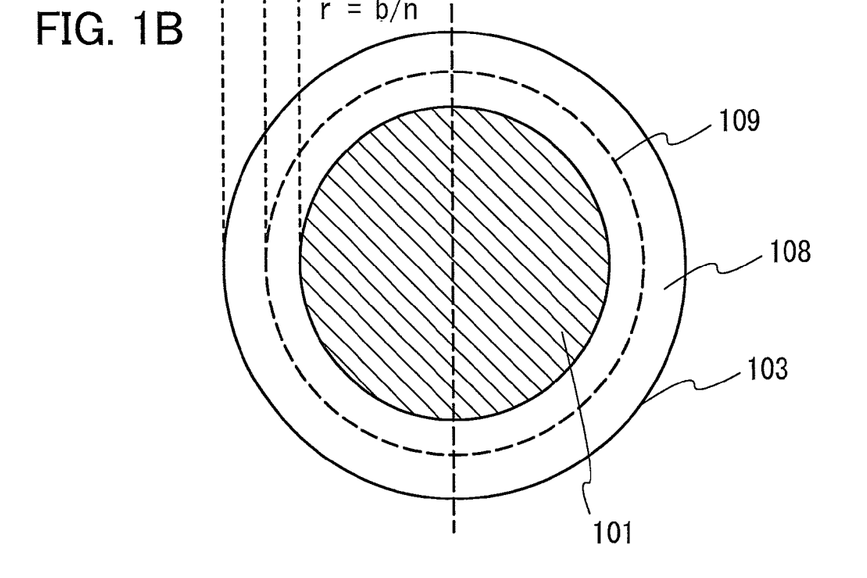

FIG. 1A is an example of a cross-sectional view of a light-emitting device, and FIG. 1B is an example of a plan view of the light-emitting device.

In FIG. 1A, the light-emitting device includes a light-emitting portion (also referred to as a light-emitting region) 101 and a hemispherical component 103 provided so as to overlap with the light-emitting portion 101. Light emitted from the light-emitting portion 101 is extracted to an external portion (such as air) 105 through the hemispherical component 103.

Light is transmitted through the hemispherical component 103, whereby total reflection of the light can be suppressed as much as possible, and thus, light extraction efficiency can be improved.

In the vicinity of an end portion 107 of the hemispherical component 103, it is difficult to suppress total reflection of light. Specifically, in the case where a radius of a bottom surface 108 of the hemispherical component 103 is b, a refractive index of the hemispherical component 103 is n, and part of the light-emitting portion 101 is provided in a region outside a circle 109 whose radius r is b/n, light emitted from the part of the light-emitting portion 101 in the region outside the circle 109 is totally reflected at an interface between the hemispherical component 103 and the air, and it is difficult to extract the light to the outside. Note that the circle 109 is a circle whose radius r from the center of the bottom surface 108 is b/n.

Thus, it is preferable that the light-emitting portion 101 be provided inside the circle 109 whose radius r from the center of the bottom surface 108 of the hemispherical component 103 is b/n.

In the case where the planar shape of the light-emitting portion 101 is a circular shape and the center thereof corresponds to the center of the hemispherical component 103 as illustrated in FIGS. 1A and 1B, a radius a of the light-emitting portion 101 is preferably less than or equal to b/n (=r) (a≤b/n).

Figure 2A:
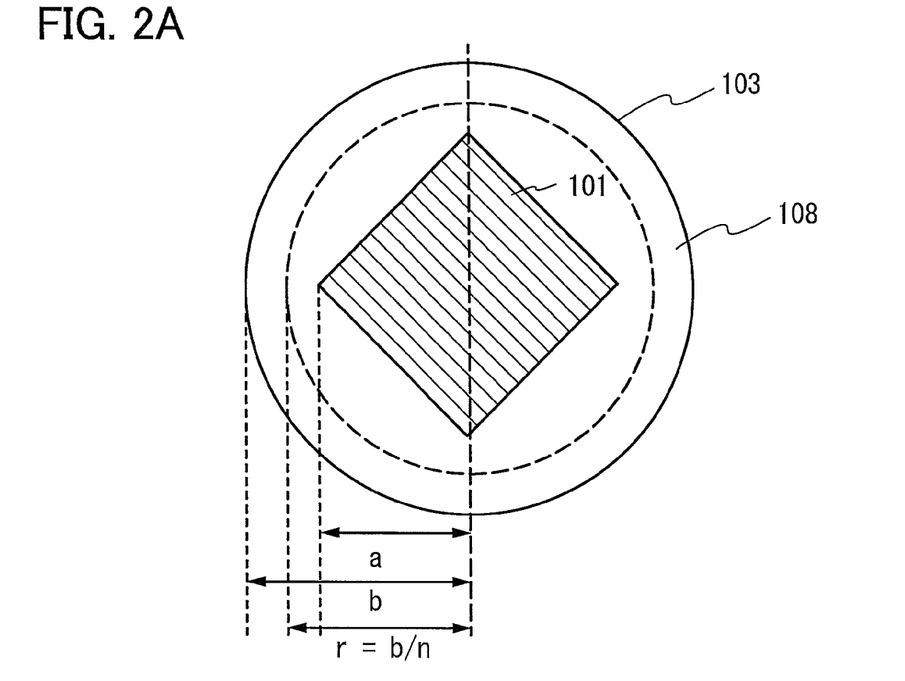
FIGS. 2A and 2B each illustrate an example of a light-emitting device.

Alternatively, the planar shape of the light-emitting portion 101 may be an elliptical shape, a shape having a vertex, an uneven shape, or the like. In such a case, a half of the major axis of the light-emitting portion 101a is preferably less than or equal to b/n (=r) (a≤b/n). For example, in the case where the light-emitting portion 101 is a square as illustrated in FIG. 2A, a half of a diagonal line a may be less than or equal to b/n (=r) (a≤b/n).

Figure 2B:
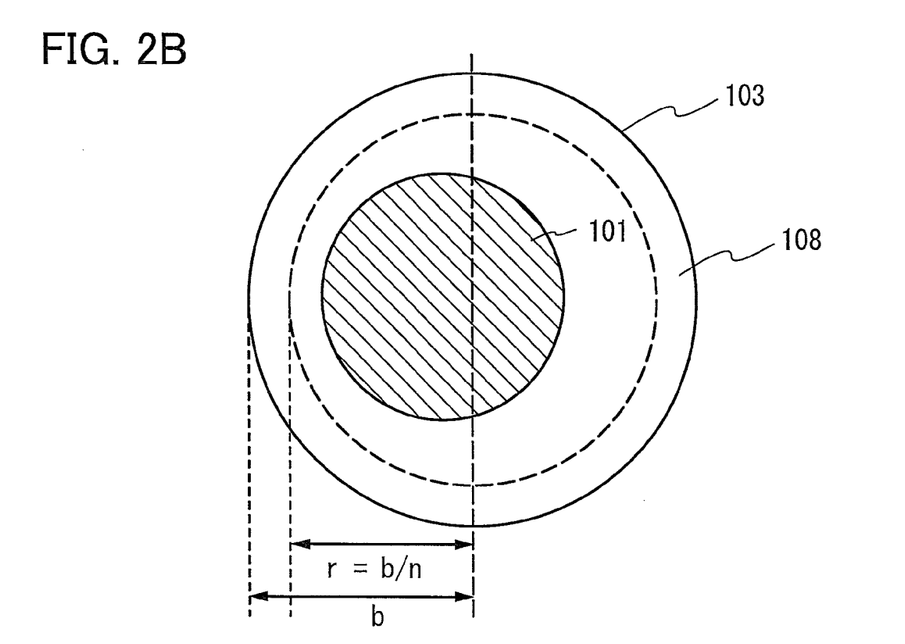

In addition, as illustrated in FIG. 2B, the center of the light-emitting portion 101 and the center of the hemispherical component 103 may be provided at different positions. In that case, the light-emitting portion 101 is preferably provided inside the circle 109 whose radius r is b/n.

Figure 3A:
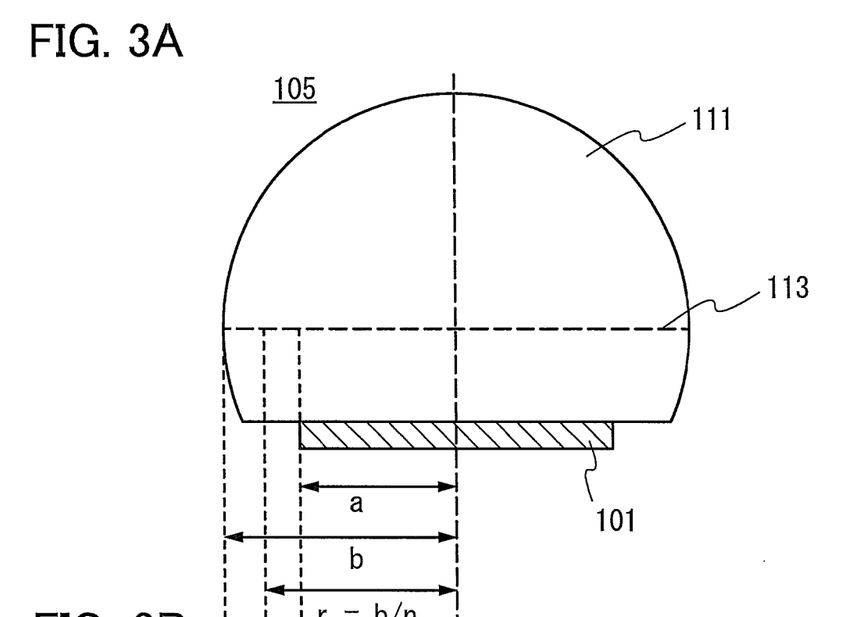
FIGS. 3A and 3B illustrate an example of a light-emitting device.
Figure 3B:
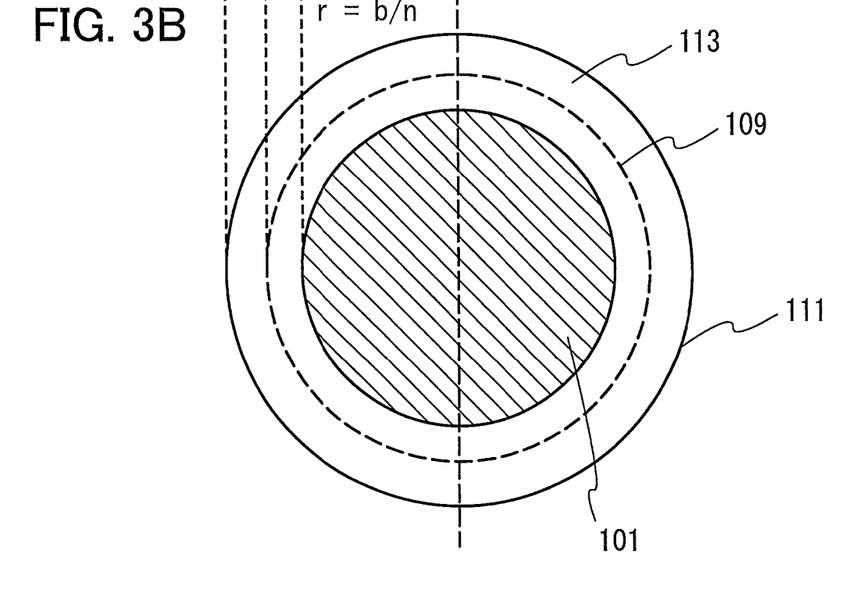

In addition, as illustrated in FIGS. 3A and 3B, instead of the hemispherical component, a spherical component 111 whose spherical surface is wider than a hemispherical surface may be used. With a spherical surface wider than a hemispherical surface, an area of a portion where light is extracted is increased, so that light extraction efficiency can be improved.

Note that in the spherical component 111, a portion where the light-emitting portion 101 is formed preferably has a flat surface. Therefore, the spherical component 111 includes a spherical component a part of which has a flat surface.

In addition, in the case of using the spherical component 111, the light-emitting portion 101 is preferably provided inside the circle 109 whose radius r from the center of a surface 113 having a maximum radius b of the spherical component 111 is b/n. Note that n is a refractive index of the spherical component 111.

In such a manner, by adjusting the position where the light-emitting portion 101 is provided, light extraction efficiency can be improved about three times.

Figure 9A:
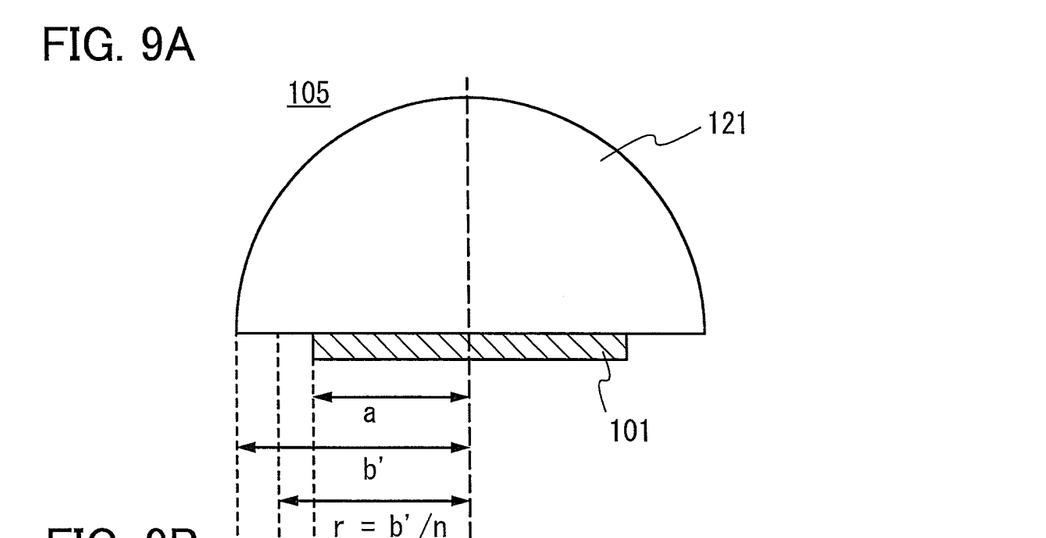
FIGS. 9A and 9B illustrate an example of a light-emitting device.
Figure 9B:
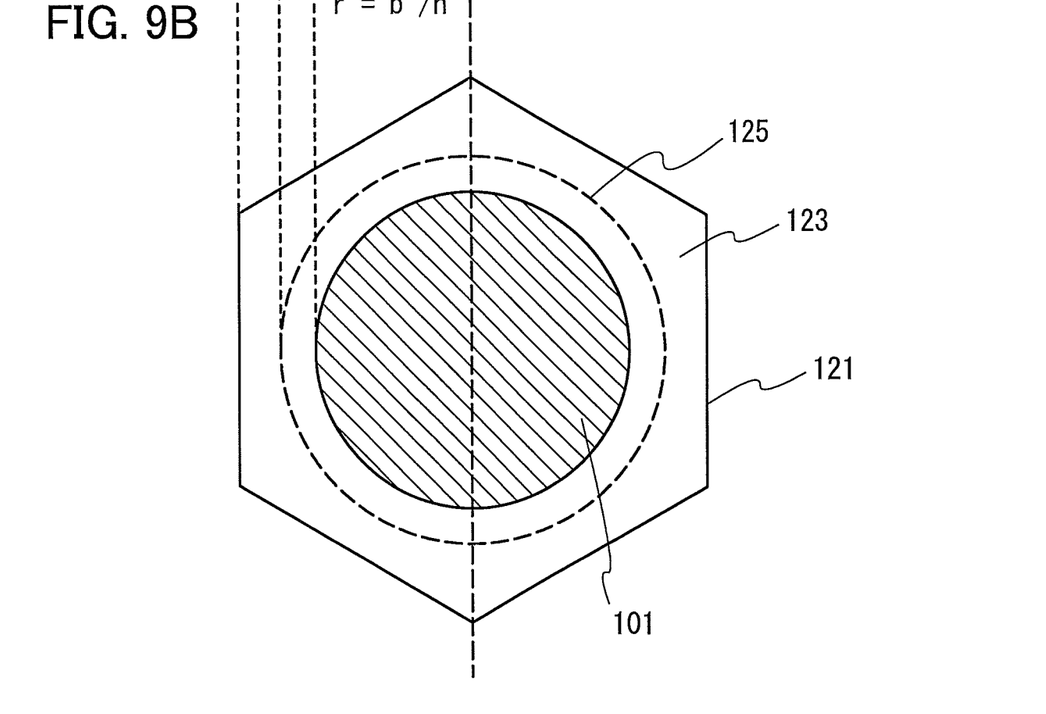

In addition, as illustrated in FIGS. 9A and 9B, instead of the hemispherical component or the spherical component, a polygonal sphere-like component 121 whose bottom surface has a polygonal shape may be used. As the polygonal sphere-like component, a hexagonal sphere-like component (whose bottom surface has a hexagonal shape) as illustrated in FIGS. 9A and 9B, an octagonal sphere-like component (whose bottom surface has an octagonal shape), or the like can be used. Note that the polygonal sphere-like component 121 may have a vertex at the top or the top thereof may be processed into a curved surface. When the polygonal sphere-like component 121 has a vertex at the top, it includes curved lines for connecting vertices of the polygonal bottom surface and the vertex of the top and a plurality of curved surfaces at a side surface.

In the case of using the polygonal sphere-like component 121, the light-emitting portion 101 is preferably provided inside a circle 125 whose radius r from the center of a bottom surface 123 of the polygonal sphere-like component 121 is b'/n. Note that n is a refractive index of the polygonal sphere-like component 121. Here, b' is the shortest length of a straight line for connecting the center and the circumference of the bottom surface 123.

Next, details of the light-emitting portion 101 will be described.

Figure 4A:
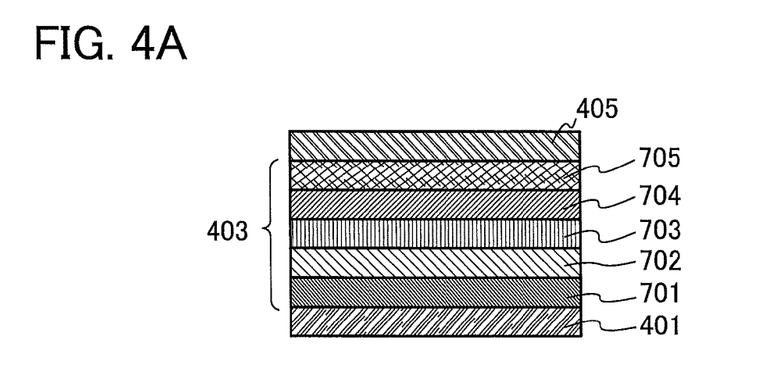
FIGS. 4A and 4B each illustrate an example of a light-emitting device.
Figure 4B:
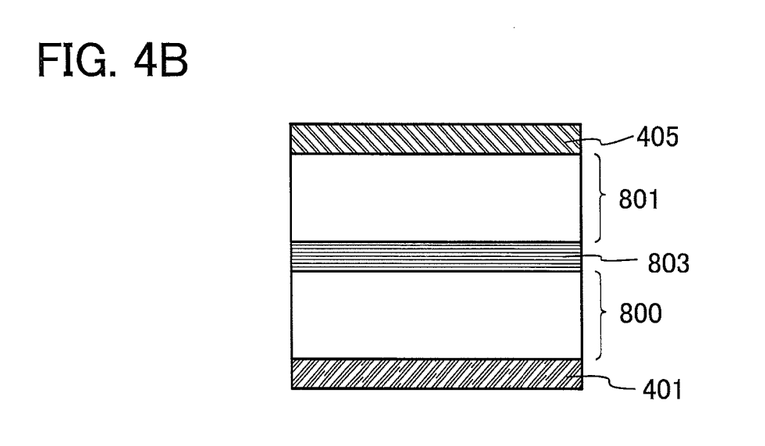

FIGS. 4A and 4B each illustrate a structural example of the light-emitting portion 101.

The light-emitting portion 101 includes a light-emitting element (also referred to as an EL element) in which a first electrode 401, an EL layer 403, and a second electrode 405 are sequentially stacked.

The first electrode 401 is provided on the hemispherical component 103 side which corresponds to a light extraction direction and is formed using a light-transmitting material. As the light-transmitting material, indium oxide, an alloy of indium oxide and tin oxide (also referred to as ITO), an alloy of indium oxide and zinc oxide (also referred to as IZO), zinc oxide, zinc oxide to which gallium is added, or the like can be used.

In addition, as the first electrode 401, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 401 may be thinned so as to be able to transmit light.

There is no particular limitation on the structure of the EL layer 403. A layer containing a substance having a high electron-transport property (also referred to as an electron-transport layer), a layer containing a substance having a high hole-transport property (also referred to as a hole-transport layer), a layer containing a substance having a high electron-injection property (also referred to as an electron-injection layer), a layer containing a substance having a high hole-injection property (also referred to as a hole-injection layer), a layer containing a bipolar substance (a substance having a high electron-transport property and a high hole-transport property) (also referred to as a bipolar layer), and the like may be appropriately stacked.

In this embodiment, as illustrated in FIG. 4A, the EL layer 403 has a structure in which a hole-injection layer 701, a hole-transport layer 702, a light-emitting layer 703, an electron-transport layer 704, and an electron-injection layer 705 are sequentially stacked. Specific materials to form the above layers will be given below.

The hole-injection layer 701 is a layer which is provided in contact with the first electrode 401 and contains a substance having a high hole-injection property. Molybdenum oxide, vanadium oxide, ruthenium oxide, tungsten oxide, manganese oxide, or the like can be used. Further, the hole-injection layer 701 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecule such as poly(ethylenedioxythiophene)/poly(styrenesulfonic acid) (PEDOT/PSS); or the like.

Alternatively, for the hole-injection layer 701, a composite material in which an acceptor substance is mixed in a substance having a high hole-transport property can be used. Note that, by using such a substance having a high hole-transport property containing an acceptor substance, a material used to form an electrode may be selected regardless of the work function of the electrode. In other words, besides a material with a high work function, a material with a low work function can be used for the first electrode 401. As the acceptor substance, 7,7,8,8-tetracyano-2,3,5,6-tetrafluoro-quinodimethane (abbreviation: $F_4$-TCNQ), chloranil, and the like can be used. In addition, a transition metal oxide can be used. In addition, oxides of metals that belong to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

As the substance having a high hole-transport property used for the composite material, any of a variety of compounds such as an aromatic amine compound, a carbazole derivative, aromatic hydrocarbon, and a high molecular compound (e.g., an oligomer, a dendrimer, or a polymer) can be used. An organic compound used for the composite material is preferably an organic compound having a high hole-transport property. Specifically, a substance having a hole mobility of greater than or equal to $10^{-6}$ cm$^2$/Vs is preferably used. However, other substances than the above-described materials may be used as long as the substances have higher hole-transport properties than electron-transport properties. Organic compounds which can be used for the composite material will be specifically given below.

As aromatic amine compounds, for example, there are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

As carbazole derivatives which can be used for the composite material, specifically, there are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, as carbazole derivatives which can be used for the composite material, there are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

As aromatic hydrocarbon which can be used for the composite material, there are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides these, pentacene, coronene, and the like can be used. In particular, an aromatic hydrocarbon which has a hole mobility of greater than or equal to $1\times10^{-6}$ cm$^2$/Vs and 14 to 42 carbon atoms is preferable.

Aromatic hydrocarbon which can be used for the composite material may have a vinyl skeleton. As the aromatic hydrocarbon having a vinyl group, for example, there are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

In addition, a high-molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

The hole-transport layer 702 is a layer containing a substance having a high hole-transport property. As the substance having a high hole-transport property, for example, the following aromatic amine compounds can be used: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances mentioned here are mainly ones that have a hole mobility of greater than or equal to $10^{-6}$ cm$^2$/V·s. However, other substances than the above-described materials may be used as long as the substances have higher hole-transport properties than electron-transport properties. The layer containing a substance having a high hole-transport property is not limited to a single layer, and two or more layers containing the aforementioned substances may be stacked.

Alternatively, a high molecular compound such as poly(N-vinylcarbazole) (abbreviation: PVK) or poly(4-vinyltriphenylamine) (abbreviation: PVTPA) can be used for the hole-transport layer 702.

The light-emitting layer 703 is a layer containing a light-emitting substance. The light-emitting layer 703 may be either a so-called single-film light-emitting layer containing an emission center material as its main component or a so-called host-guest type light-emitting layer in which an emission center material is dispersed in a host material.

There is no particular limitation on the emission center material that is used, and known fluorescent materials or phosphorescent materials can be used. As fluorescent materials, for example, in addition to N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like, there are fluorescent materials with an emission wavelength of greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent materials, for example, in addition to bis[2-(4',6'-difluorophenyl)pyridinato-N,$C^{2'}$]iridium(III)tetrakis(1-pyrazolyl)borate (abbreviation: FIr6) and the like, there are phosphorescent materials with an emission wavelength in the range of 470 nm to 500 nm, such as bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIracac); and phosphorescent materials with an emission wavelength of greater than or equal to 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-a]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). The emission center material can be selected from the above-mentioned materials or other known materials in consideration of the emission color of each light-emitting element.

When the host material is used, for example, the following can be used: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)

triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3''-(benzene-1,3,5-triyl)tripyrene (abbreviation: TPB3). From these materials or other known materials, a material may be selected which has a larger energy gap (if the material emits phosphorescence, larger triplet energy) than an emission center material dispersed in the material and which has a transport property needed for the layer.

The electron-transport layer 704 is a layer which contains a substance having a high electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyl)henyl)benzoxazolato]zinc (abbreviation: Zn(BOX)$_2$) or bis[2-(2-hydroxyl)henyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly ones that have an electron mobility of greater than or equal to $10^{-6}$ cm$^2$/V·s. Note that other substances may be used for the electron-transport layer 704 as long as the substances have higher electron-transport properties than hole-transport properties.

Further, the electron-transport layer 704 is not limited to a single layer and may be a stack of two or more layers containing the substances given above.

Further, a layer for controlling transport of electron carriers may be provided between the electron-transport layer 704 and the light-emitting layer 703. Specifically, the layer for controlling transport of electron carriers is a layer formed by adding a small amount of a substance having a high electron-trapping property to the material having a high electron-transport property as described above; by controlling transport of electron carriers with the layer, carrier balance can be adjusted. Such a structure is very effective in suppressing problems (e.g., a reduction in element lifetime) caused by a phenomenon in which an electron passes through the light-emitting layer 703.

For the electron-injection layer 705, an alkali metal, an alkaline-earth metal, or a compound thereof such as lithium fluoride (LiF), cesium fluoride (CsF), or calcium fluoride (CaF$_2$) can be used. For example, a layer of a substance having an electron-transport property containing an alkali metal, an alkaline earth metal, or a compound thereof, such as Alq which contains magnesium (Mg), can be used. Note that a layer which contains a substance having an electron-transport property and further contains an alkali metal or an alkaline earth metal is preferably used for the electron-injection layer 705, in which case electron injection from the second electrode 405 can be performed efficiently.

The second electrode 405 is provided opposite to the side where light is extracted and is formed using a reflective material. As the reflective material, a metal material such as aluminum, gold, platinum, nickel, tungsten, chromium, molybdenum, iron, cobalt, copper, or palladium can be used. Note that the second electrode 405 is also referred to as a reflective electrode.

Note that a plurality of the above-mentioned EL layers 403 may be stacked between the first electrode 401 and the second electrode 405 as illustrated in FIG. 4B. In that case, a charge generation layer 803 is preferably provided between a first EL layer 800 and a second EL layer 801 which are stacked. The charge generation layer 803 can be formed by using the above-mentioned composite material. Further, the charge generation layer 803 may have a stacked structure including a layer containing the composite material and a layer containing another material. In that case, as the layer containing another material, a layer containing an electron-donating substance and a substance having a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained owing to expansion in the choice of materials. Moreover, a light-emitting element which provides phosphorescence from one of the EL layers and fluorescence from the other of the EL layers can be readily obtained. Note that this structure can be combined with the above-mentioned structure of the EL layer.

The structure illustrated in FIG. 4B is particularly preferable for obtaining white light emission. A light-emitting device and a lighting device with high quality can be manufactured by combining the structure illustrated in FIG. 4A with the structure illustrated in FIG. 4B.

This embodiment can be combined with any of the other embodiments as appropriate.

Embodiment 2

In this embodiment, an example of a structure of a light-emitting device and an example of a method for manufacturing the light-emitting device will be described.

Figure 5A:
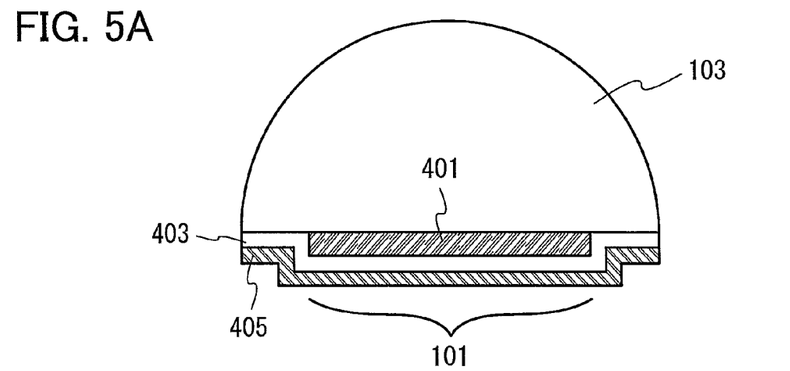
FIGS. 5A to 5C each illustrate an example of a light-emitting device.

FIG. 5A is an example of a cross-sectional view of a light-emitting device.

In FIG. 5A, a light-emitting portion 101 is formed at a bottom surface of a hemispherical component 103.

The hemispherical component 103 is provided on the side which corresponds to a light extraction direction and is thus formed using a light-transmitting material. As the light-transmitting material, glass, resin, or the like can be used. Such a material can be formed into a hemispherical shape by using etching, an electron beam, a laser beam, a mold, or the like.

As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used.

The light-emitting portion 101 can have the structure illustrated in FIG. 4A or 4B.

First, a first electrode 401 included in the light-emitting portion 101 is formed over the bottom surface of the hemispherical component 103. The first electrode 401 can be formed to be a single layer or a stacked layer using the above-described material by a sputtering method, a vacuum evaporation method, or the like.

By forming the first electrode 401 into an island shape with the use of a mask or the like, the light-emitting portion 101 can be formed at the position illustrated in FIGS. 1A and 1B, FIG. 2A, or FIG. 2B. Note that the first electrode 401 can also be formed into an island shape by a photolithography method.

Next, an EL layer 403 included in the light-emitting portion 101 is formed over the first electrode 401. The EL layer 403 can be formed to be a single layer or a stacked layer using the above-described material by a vacuum evaporation method or the like.

Next, a second electrode 405 included in the light-emitting portion 101 is formed over the EL layer 403. The second electrode 405 can be formed to be a single layer or a stacked layer using the above-described material by a sputtering method, a vacuum evaporation method, or the like.

By being formed so as to cover the first electrode 401, the second electrode 405 can be improved in its function as a reflective electrode. In addition, by being formed so as to cover the EL layer 403 in a light-emitting region (the light-emitting portion 101), the second electrode 405 can be improved in its function as a reflective electrode.

Note that the second electrode 405 may be formed into an island shape without forming the first electrode 401 into an island shape. Alternatively, the first electrode 401 and the second electrode 405 may each be formed into an island shape. Further alternatively, the first electrode 401, the EL layer 403, and the second electrode 405 may each be formed into an island shape.

Although the light-emitting portion 101 is formed over the component 103 which has been formed into a hemispherical shape in FIG. 5A, the component 103 may be formed into a hemispherical shape after forming the light-emitting portion 101.

A wiring, a terminal, and the like connected to each of the electrodes are provided as appropriate, so that the light-emitting device can be manufactured.

Figure 5B:
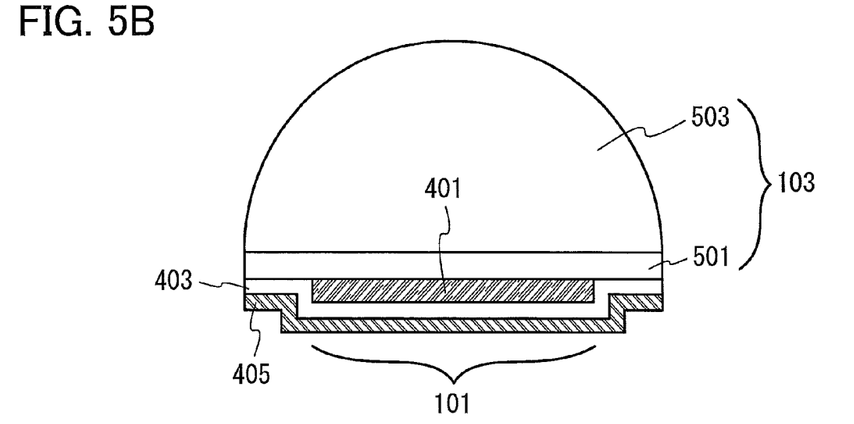
Figure 5C:
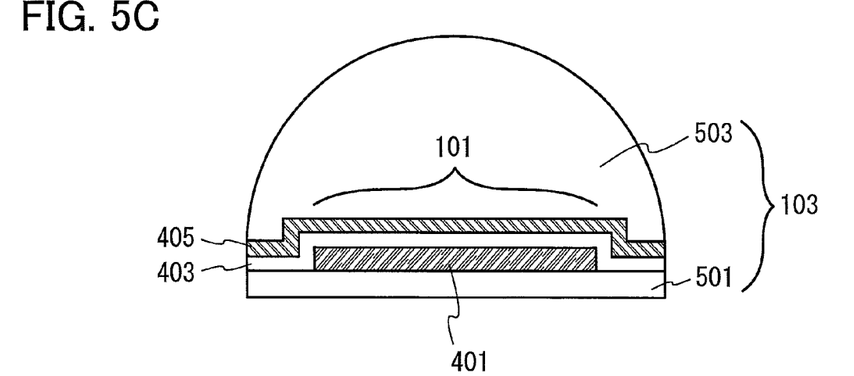

FIGS. 5B and 5C are other examples of a cross-sectional view of a light-emitting device.

In FIGS. 5B and 5C, the hemispherical component 103 includes a plate-like component 501 and a hemispherical component 503.

Glass is preferably used for a material of the plate-like component 501, and resin is preferably used for a material of the hemispherical component 503. This is because the light-emitting portion 101 can be easily formed over glass and resin can be easily processed into a hemispherical shape. However, an embodiment of the present invention is not limited thereto, and a material for each component can be selected as appropriate.

In FIG. 5B, the light-emitting portion 101 is formed over one surface of the plate-like component 501. The hemispherical component 503 is formed over the other surface of the plate-like component 501.

In FIG. 5C, the light-emitting portion 101 is formed over one surface of the plate-like component 501. The hemispherical component 503 is also formed over the one surface of the plate-like component 501 so as to cover the light-emitting portion 101.

The structure and the manufacturing method of the light-emitting portion 101 are similar to those in FIG. 5A.

Note that the spherical component 111 illustrated in FIGS. 3A and 3B may be used. Alternatively, the polygonal sphere-like component 121 illustrated in FIGS. 9A and 9B may be used.

Also, the hemispherical component (or the spherical component or the polygonal sphere-like component) may have oblateness or the like caused owing to a slight error in the manufacture. A shape in which total reflection can be reduced as much as possible between the hemispherical component (or the spherical component or the polygonal sphere-like component) and the air can be employed.

Note that a refractive index of the hemispherical component (or the spherical component or the polygonal sphere-like component) may be greater than or equal to a refractive index of the light-emitting layer included in the light-emitting portion. In such a manner, total reflection can be suppressed when light enters the hemispherical component (or the spherical component or the polygonal sphere-like component). In the case of the structure illustrated in FIG. 5B, light enters the plate-like component and the hemispherical component (or the spherical component or the polygonal sphere-like component) in this order; therefore, a refractive index of the hemispherical component (or the spherical component or the polygonal sphere-like component) may be greater than or equal to a refractive index of the plate-like component, and the refractive index of the plate-like component may be greater than or equal to a refractive index of the light-emitting layer. In this way, when light enters the plate-like component and the hemispherical component (or the spherical component or the polygonal sphere-like component), total reflection can be suppressed.

This embodiment can be combined with any of the other embodiments as appropriate.

Embodiment 3

In this embodiment, an example of a structure of a light-emitting device and an example of a method for manufacturing the light-emitting device will be described.

Figure 6A:
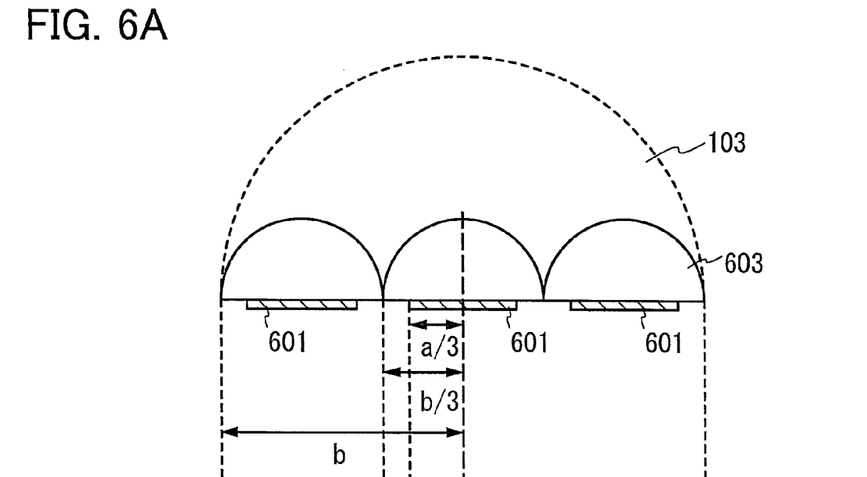
FIGS. 6A and 6B illustrate an example of a light-emitting device.
Figure 6B:
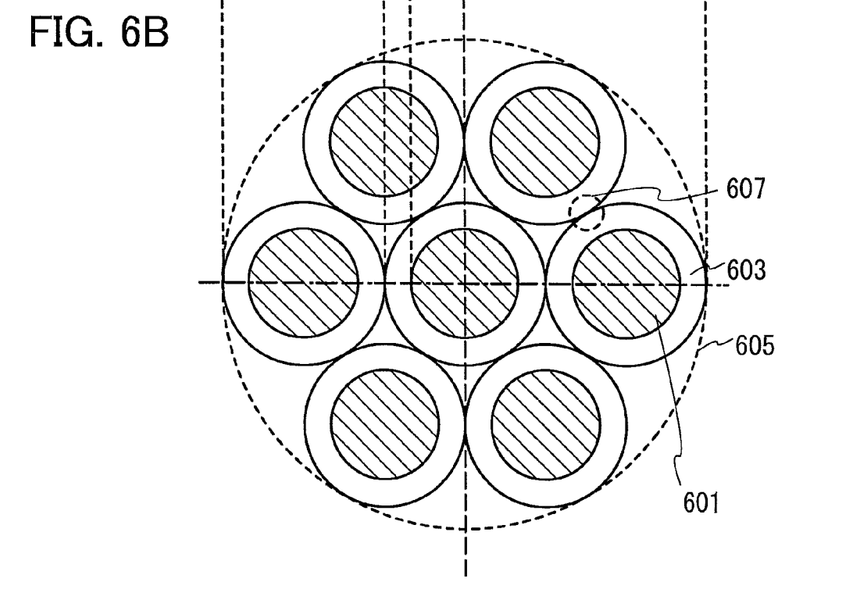

FIG. 6A is an example of a cross-sectional view of a light-emitting device, and FIG. 6B is an example of a plan view of the light-emitting device.

The light-emitting device illustrated in FIGS. 6A and 6B includes a plurality of light-emitting portions 601 and a plurality of hemispherical components 603 which overlap with the plurality of light-emitting portions 601. That is, the light-emitting device illustrated in FIGS. 6A and 6B includes a plurality of elements each having a pair of the light-emitting portion 601 and the hemispherical component 603.

Further, as illustrated in FIG. 6B, the plurality of elements are arranged with a closest packed structure. Seven elements are illustrated in FIG. 6B, but the number of the elements is not limited thereto; it is sufficient as long as the light-emitting device includes a plurality of elements. Alternatively, the plurality of hemispherical components 603 may be integrated to form one component (also referred to as an integrated component). An integrated component includes a plurality of hemispherical portions.

Since part of the hemispherical component 603 exists between the adjacent light-emitting portions 601 in FIGS. 6A and 6B, the area of a light-emitting region is about a third as compared to the case where the hemispherical component 603 is not used. When the area of the light-emitting region is reduced to a third, current is also reduced to a third, so that power consumption (i.e., voltage×current) is reduced to a third.

However, since light extraction efficiency is improved about three times by using the hemispherical component 603 as described above, total luminous flux remains substantially the same even through the area of the light-emitting region is reduced to a third.

In addition, in consideration of a relation "energy efficiency (lm/W)=total luminous flux (lm)/consumed power (W)", energy efficiency can be improved about three times in the light-emitting device illustrated in FIGS. 6A and 6B.

In addition, a radius of the hemispherical component 603 in FIGS. 6A and 6B is a third the radius b of the hemispherical component 103 in FIGS. 1A and 1B. The elements are arranged with a closest packed structure inside a circle 605 having the radius b. By arranging the elements as illustrated in FIGS. 6A and 6B, light extraction efficiency equal to that in FIGS. 1A and 1B can be obtained, while the thickness of a cross section of the light-emitting device can be reduced to a third. That is, a thin light-emitting device having high light extraction efficiency can be provided.

Here, the closest packed structure means a structure in which in a portion 607 where the plurality of hemispherical components are adjacent to each other, a space is not formed as much as possible but also includes a structure in which some spaces are formed owing to a slight error in the manufacture. In addition, it is sufficient as long as the plurality of hemispherical components are arranged with a closest packed structure, and it is not always necessary to define the circle 605 as in FIG. 6B. Further, by using the polygonal sphere-like component 121 illustrated in FIGS. 9A and 9B, since the bottom surface thereof has a polygonal shape, a space between the plurality of polygonal sphere-like components can be smaller.

Note that the position and the structure of the light-emitting portion 601 are similar to those in FIGS. 1A and 1B, FIGS. 2A and 2B, and FIGS. 3A and 3B.

Next, an example of a method for manufacturing a light-emitting device including a plurality of elements will be described.

Figure 7A:
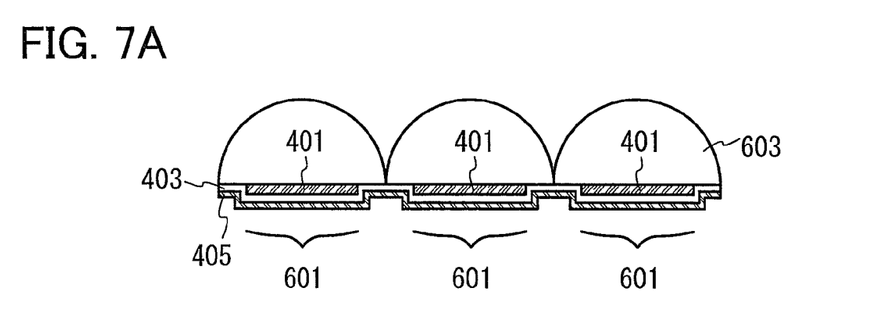
FIGS. 7A to 7C each illustrate an example of a light-emitting device.

FIG. 7A is an example of a cross-sectional view of a light-emitting device.

In FIG. 7A, light-emitting portions 601 are formed at bottom surfaces of a plurality of hemispherical components 603 arranged with a closest packed structure. As described above, the plurality of hemispherical components 603 may be integrated to form one component. With an integrated component, the light-emitting device can be easily manufactured.

The light-emitting portion 601 can have the structure illustrated in FIG. 4A or 4B.

First, a first electrode 401 included in the light-emitting portion 601 is formed over the hemispherical component 603. The first electrode 401 can be formed to be a single layer or a stacked layer using the above-described material by a sputtering method, a vacuum evaporation method, or the like.

By forming the first electrode 401 into an island shape with the use of a mask or the like, the light-emitting portion 601 can be formed at the position illustrated in FIGS. 1A and 1B, FIG. 2A, or FIG. 2B. Note that the first electrode 401 can also be formed into an island shape by a photolithography method.

Next, an EL layer 403 included in the light-emitting portion 601 is formed over the first electrode 401. The EL layer 403 can be formed to be a single layer or a stacked layer using the above-described material by a vacuum evaporation method or the like.

Next, a second electrode 405 included in the light-emitting portion 601 is formed over the EL layer 403. The second electrode 405 can be formed to be a single layer or a stacked layer using the above-described material by a sputtering method, a vacuum evaporation method, or the like.

By being formed so as to cover the first electrode 401, the second electrode 405 can be improved in its function as a reflective electrode. In addition, by being formed so as to cover the EL layer 403 in a light-emitting region (the light-emitting portion 601), the second electrode 405 can be improved in its function as a reflective electrode.

Note that the second electrode 405 may be formed into an island shape without forming the first electrode 401 into an island shape. Alternatively, the first electrode 401 and the second electrode 405 may each be formed into an island shape. Further alternatively, the first electrode 401, the EL layer 403, and the second electrode 405 may each be formed into an island shape.

Although the light-emitting portion 601 is formed over the component 603 which has been formed into a hemispherical shape in FIG. 7A, the component 603 may be formed into a hemispherical shape after forming the light-emitting portion 601.

A wiring, a terminal, and the like connected to each of the electrodes are provided as appropriate, so that the light-emitting device can be manufactured.

Figure 7B:
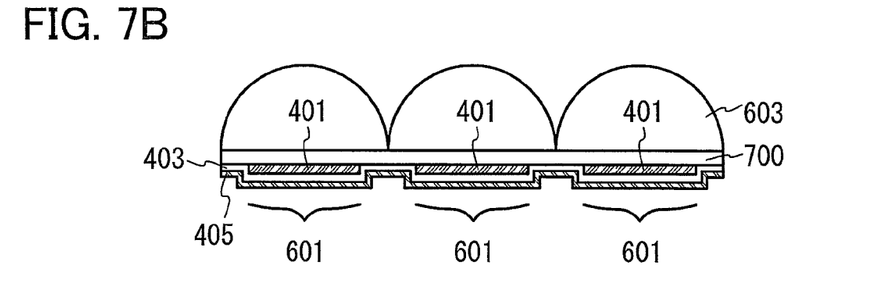
Figure 7C:
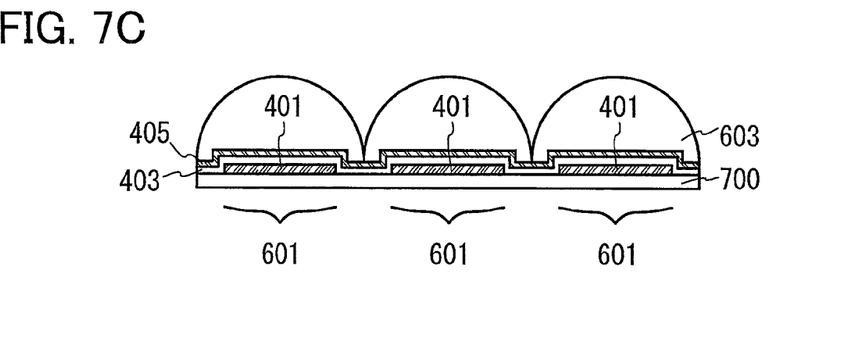

FIGS. 7B and 7C are other examples of a cross-sectional view of a light-emitting device.

In FIGS. 7B and 7C, the light-emitting device includes a plate-like component 700 and a plurality of hemispherical components 603.

Glass is preferably used for a material of the plate-like component 700, and resin is preferably used for a material of the hemispherical component 603. This is because the light-emitting portion 601 can be easily formed over glass and resin can be easily processed into a hemispherical shape. However, an embodiment of the present invention is not limited thereto, and a material for each component can be selected as appropriate.

In FIG. 7B, the plurality of light-emitting portions 601 are formed over one surface of the plate-like component 700. The hemispherical components 603 are formed over the other surface of the plate-like component 700 so as to overlap with the plurality of light-emitting portions 601.

In FIG. 7C, the plurality of light-emitting portions 601 are formed over one surface of the plate-like component 700. The hemispherical components 603 are also formed over the one surface of the plate-like component 700 so as to cover the plurality of light-emitting portions 601.

The structure and the manufacturing method of the light-emitting portion 601 are similar to those in FIG. 7A.

Note that the spherical component 111 illustrated in FIGS. 3A and 3B may be used.

In addition, some of the hemispherical components (or the spherical components or the polygonal sphere-like components) may also have oblateness or the like caused owing to a slight error in the manufacture. For example, the top or the side surface of the component may have a flat surface. A shape in which total reflection can be reduced as much as possible between the hemispherical component (or the spherical component or the polygonal sphere-like component) and the air can be employed.

Note that a refractive index of the hemispherical component (or the spherical component or the polygonal sphere-like component) may be greater than or equal to a refractive index of the light-emitting layer included in the light-emitting portion. In such a manner, total reflection can be suppressed when light enters the hemispherical component (or the spherical component or the polygonal sphere-like component). In the case of the structure illustrated in FIG. 7B, light enters the plate-like component and the hemispherical component (or the spherical component or the polygonal sphere-like component) in this order; therefore, a refractive index of the hemispherical component (or the spherical component or the polygonal sphere-like component) may be greater than or equal to a refractive index of the plate-like component, and the refractive index of the plate-like component may be greater than or equal to a refractive index of the light-emitting layer. In this way, when light enters the plate-like component and the hemispherical component (or the spherical component or the polygonal sphere-like component), total reflection can be suppressed.

This embodiment can be combined with any of the other embodiments as appropriate.

Embodiment 4

In this embodiment, examples of an electronic device will be described.

Figure 8A:
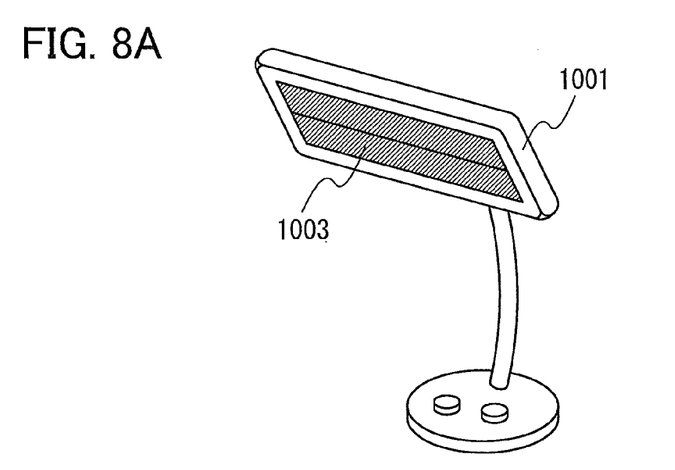
FIGS. 8A and 8B each illustrate an example of an electronic device.

FIG. 8A illustrates an example in which the light-emitting device according to the present invention is used for a desk lamp which is a lighting device. The desk lamp includes a housing 1001 and a light source 1003. The light-emitting device according to the present invention is used as the light source 1003.

Figure 8B:
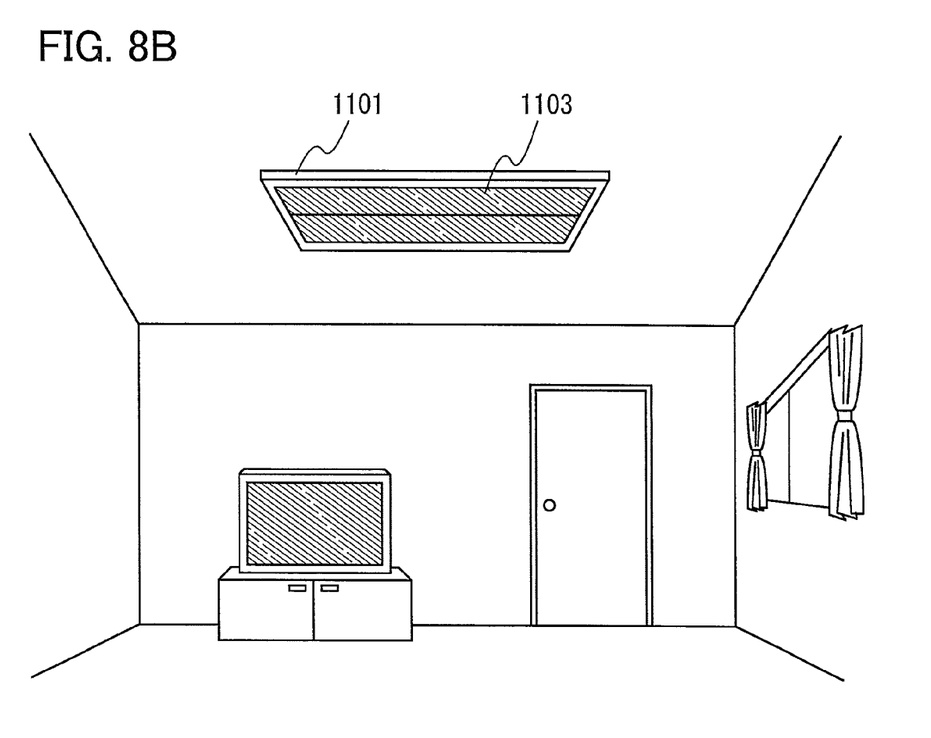

FIG. 8B illustrates an example in which the light-emitting device according to the present invention is used for an indoor lighting device. The lighting device includes a housing 1101 and a light source 1103. The light-emitting device according to the present invention is used as the light source 1103.

This embodiment can be combined with any of the other embodiments as appropriate.

This application is based on Japanese Patent Application serial no. 2010-166961 filed with Japan Patent Office on Jul. 26, 2010, the entire contents of which are hereby incorporated by reference.

What is claimed is:

1. A light-emitting device comprising:
a substrate;
a first electrode over the substrate;
a light-emitting layer over the first electrode;
a second electrode over the light-emitting layer; and
a hemispherical component on and in contact with the second electrode, an edge of the hemispherical component aligned with an edge of the second electrode,
wherein a refractive index of the hemispherical component is greater than or equal to a refractive index of the light-emitting layer, and
wherein an area of a bottom surface of the hemispherical component is larger than an area of the first electrode.

2. The light-emitting device according to claim 1, wherein the substrate comprises glass.

3. The light-emitting device according to claim 1, wherein the hemispherical component comprises resin.

4. A lighting device comprising the light-emitting device according to claim 1.

5. A light-emitting device comprising:
a substrate;
a plurality of first electrodes over a first surface of the substrate;
a light-emitting layer over the plurality of first electrodes; and
a second electrode layer over the light-emitting layer; and
a plurality of hemispherical components on and in contact with the second electrode layer, each of the plurality of hemispherical components overlapping with each of the plurality of first electrodes,
wherein an area of a bottom surface of each of the plurality of hemispherical components is larger than an area of each of the plurality of first electrodes.

6. The light-emitting device according to claim 5, wherein the plurality of hemispherical components are arranged with a closest packed structure.

7. The light-emitting device according to claim 5, wherein the refractive index of each of the plurality of hemispherical components is greater than or equal to a refractive index of the substrate.

8. The light-emitting device according to claim 5, wherein the substrate comprises glass.

9. The light-emitting device according to claim 5, wherein each of the plurality of hemispherical components comprises resin.

10. A lighting device comprising the light-emitting device according to claim 5.

11. The light-emitting device according to claim 5, wherein an edge of plurality of hemispherical components is aligned with an edge of the second electrode layer.

12. A light-emitting device comprising:
a substrate;
a first electrode over the substrate;
a light-emitting layer over the first electrode;
a second electrode over the light-emitting layer; and
a hemispherical component on and in contact with the second electrode, an edge of the hemispherical component aligned with an edge of the second electrode,
wherein an area of a bottom surface of the hemispherical component is larger than an area of the first electrode,
wherein a refractive index of the hemispherical component is n and a radius of a region of the substrate which is covered by the hemispherical component is b, and
wherein the light-emitting layer is provided inside a circle whose radius r from a center of the region of the substrate is b/n.

13. The light-emitting device according to claim 12, wherein the refractive index of the hemispherical component is greater than or equal to a refractive index of the substrate.

14. The light-emitting device according to claim 12, wherein the substrate comprises glass.

15. The light-emitting device according to claim 12, wherein the hemispherical component comprises resin.

16. A lighting device comprising the light-emitting device according to claim 12.

* * * * *